US009905801B2

(12) United States Patent
Kim

(10) Patent No.: US 9,905,801 B2
(45) Date of Patent: Feb. 27, 2018

(54) ORGANIC LIGHT-EMITTING DISPLAY DEVICE

(71) Applicant: SAMSUNG DISPLAY CO., LTD., Yongin-si, Gyeonggi-do (KR)

(72) Inventor: Yongjin Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/019,774

(22) Filed: Feb. 9, 2016

(65) Prior Publication Data

US 2016/0336541 A1 Nov. 17, 2016

(30) Foreign Application Priority Data

May 12, 2015 (KR) .................. 10-2015-0066242

(51) Int. Cl.
| | | |
|---|---|---|
| *H01L 51/52* | (2006.01) | |
| *H01L 27/32* | (2006.01) | |
| *H01L 27/12* | (2006.01) | |

(52) U.S. Cl.
CPC ...... *H01L 51/5253* (2013.01); *H01L 51/5246* (2013.01); *H01L 51/5256* (2013.01); *H01L 27/1248* (2013.01); *H01L 27/1255* (2013.01); *H01L 27/3262* (2013.01); *H01L 27/3265* (2013.01)

(58) Field of Classification Search
CPC ............ H01L 51/5253; H01L 27/3265; H01L 27/3262; H01L 27/1255; H01L 27/1248
See application file for complete search history.

(56) References Cited

U.S. PATENT DOCUMENTS

| | | | |
|---|---|---|---|
| 2007/0222375 A1* | 9/2007 | Liu | H01L 27/322 313/506 |
| 2012/0133275 A1 | 5/2012 | Lee et al. | |
| 2012/0206684 A1* | 8/2012 | Lee | G02F 1/1345 349/139 |
| 2014/0159000 A1 | 6/2014 | Kang | |
| 2014/0183502 A1* | 7/2014 | Song | H01L 27/3246 257/40 |
| 2014/0306195 A1 | 10/2014 | Oh et al. | |
| 2015/0034935 A1* | 2/2015 | Choi | H01L 51/0097 257/40 |
| 2015/0060806 A1* | 3/2015 | Park | H01L 51/5253 257/40 |
| 2015/0062524 A1* | 3/2015 | Kim | G02F 1/1339 349/153 |
| 2015/0171367 A1 | 6/2015 | Moon | |

(Continued)

FOREIGN PATENT DOCUMENTS

| | | |
|---|---|---|
| KR | 10-2012-0057286 A | 6/2012 |
| KR | 10-2013-0075076 A | 7/2013 |

(Continued)

*Primary Examiner* — Jarrett Stark
(74) *Attorney, Agent, or Firm* — Lewis Roca Rothgerber Christie LLP

(57) ABSTRACT

An organic light-emitting display device includes: a substrate; a driving thin film transistor on the substrate; and a DAM at an outermost portion of the substrate, where the DAM includes an inorganic layer and includes a first metallic DAM. The first metallic DAM may include two or more metal layers spaced apart at a set interval.

21 Claims, 6 Drawing Sheets

(56) References Cited

U.S. PATENT DOCUMENTS

| | | | |
|---|---|---|---|
| 2015/0380685 A1* | 12/2015 | Lee | H01L 51/5243 257/40 |
| 2016/0035997 A1* | 2/2016 | Oh | H01L 51/5246 257/40 |
| 2016/0043348 A1* | 2/2016 | Zhang | H01L 51/5256 257/40 |
| 2016/0064686 A1* | 3/2016 | Odaka | H01L 51/5246 257/89 |
| 2016/0077383 A1* | 3/2016 | Lee | G02F 1/133723 349/43 |
| 2016/0111677 A1* | 4/2016 | Hong | H01L 51/5246 257/40 |
| 2016/0147094 A1* | 5/2016 | Choi | G02F 1/1337 349/124 |
| 2016/0190503 A1* | 6/2016 | Chang | H01L 51/52 257/40 |
| 2016/0204373 A1* | 7/2016 | Park | H01L 51/524 257/40 |
| 2016/0260928 A1* | 9/2016 | Choi | H01L 51/5256 |
| 2016/0270209 A1* | 9/2016 | Cho | H05K 1/028 |
| 2016/0307971 A1* | 10/2016 | Jeon | H01L 27/3225 |
| 2016/0336541 A1* | 11/2016 | Kim | H01L 51/5253 |

FOREIGN PATENT DOCUMENTS

| | | |
|---|---|---|
| KR | 10-2014-0073200 A | 6/2014 |
| KR | 10-2014-0123328 A | 10/2014 |
| KR | 10-2015-0071538 A | 6/2015 |

\* cited by examiner

ORGANIC LIGHT-EMITTING DISPLAY DEVICE

CROSS-REFERENCE TO RELATED APPLICATION

This application claims priority to and the benefit of Korean Patent Application No. 10-2015-0066242, filed on May 12, 2015, in the Korean Intellectual Property Office, the entire content of which is incorporated herein by reference.

BACKGROUND

1. Field

One or more exemplary embodiments relate to an organic light-emitting display device.

2. Description of the Related Art

An organic light-emitting display device includes an organic light-emitting diode including a hole injection electrode, an electron injection electrode, and an organic emission layer disposed therebetween. The organic light-emitting display device is a self-luminous display device in which an exciton generated when a hole injected from the hole injection electrode and an electron injected from the electron injection electrode recombine in the organic emission layer and the exciton falls down (e.g., transition) from an excited state to a ground state to emit light.

Since the organic light-emitting display device, which is a self-luminous display device, does not require a separate light source, it may be driven by a low voltage and configured in a lightweight and slim profile, and provides high quality characteristics such as a wide viewing angle, high contrast, a fast respond speed, etc., so that it is in the limelight as a next-generation display device.

SUMMARY

One or more exemplary embodiments include an organic light-emitting display device.

Additional aspects of embodiments will be set forth in part in the description which follows and, in part, will be apparent from the description, or may be learned by practice of the presented embodiments.

According to one or more exemplary embodiments, an organic light-emitting display device includes: a substrate; a driving thin film transistor provided on the substrate; and a DAM disposed at an outermost portion of the substrate, and the DAM includes an inorganic layer and includes a first metallic DAM therein.

The first metallic DAM may include two or more metals spaced apart at a set interval.

The first metallic DAM may include three metals spaced apart at a set interval.

The DAM may have a step difference between an upper portion of the inorganic layer and a lower portion of the inorganic layer based on the first metallic DAM.

The first metallic DAM is formed on an upper portion of a gate insulating layer; and the DAM may further include a first interlayer insulating layer provided on an upper portion of the first metallic DAM.

The organic light-emitting display device may further include: a storage capacitor including a first electrode coupled or connected with a driving gate electrode of the driving thin film transistor, and a second electrode provided on an upper portion of the first electrode and insulated from the first electrode, and the driving gate electrode and the first electrode may be integrally formed in a same layer, and the first metallic DAM may be formed in the layer in which the driving gate electrode and the first electrode are formed.

The first interlayer insulating layer may be formed between the first electrode and the second electrode and may insulate the second electrode from the first electrode.

The organic light-emitting display device may further include: a second interlayer insulating layer disposed on the first interlayer insulating layer and including an opening that exposes a portion of the first interlayer insulating layer, and the second electrode may be disposed in the opening.

The organic light-emitting display device may further include: an organic light-emitting diode formed on an upper portion of the driving thin film transistor; and an encapsulation structure formed on an upper portion of the organic light-emitting diode and sealing the organic light-emitting diode, and the encapsulation structure may include alternately stacked thin film encapsulation organic layers and thin film encapsulation inorganic layers.

The DAM may further include a thin film encapsulation inorganic layer and extend to a portion of the first interlayer insulating layer.

The DAM may include a second metallic DAM formed on an upper portion of the first metallic DAM.

The second metallic DAM may include two or more metals spaced apart at a set interval.

The DAM may further include: a first interlayer insulating layer formed between the first metallic DAM and the second metallic DAM; and a second interlayer insulating layer formed on an upper portion of the first interlayer insulating layer and covering the second metallic DAM.

The organic light-emitting display device may further include: a storage capacitor including a first electrode coupled or connected with a driving gate electrode of the driving thin film transistor, and a second electrode provided on an upper portion of the first electrode and insulated from the first electrode, and the driving gate electrode and the first electrode may be integrally formed in a same layer, the first metallic DAM may be formed in the layer in which the driving gate electrode and the first electrode are formed, and the second metallic DAM may be formed in a layer in which the second electrode is formed.

The organic light-emitting display device may further include: a second interlayer insulating layer disposed on the first interlayer insulating layer and including an opening that exposes a portion of the first interlayer insulating layer, and the second electrode may be disposed in the opening.

The organic light-emitting display device may further include: an organic light-emitting diode formed on an upper portion of the driving thin film transistor; and an encapsulation structure formed on an upper portion of the organic light-emitting diode, including alternatively stacked thin film encapsulation organic layers and thin film encapsulation inorganic layers, and sealing the organic light-emitting diode, and the DAM may further include a thin film encapsulation inorganic layer and extend to a portion of the second interlayer insulating layer.

The DAM may further include a third metallic DAM formed on an upper portion of the second metallic DAM.

The third metallic DAM may include two or more metals spaced apart at a set interval.

The DAM may further include: a first interlayer insulating layer formed between the first metallic DAM and the second metallic DAM; a second interlayer insulating layer formed on an upper portion of the second metallic DAM; and a thin film encapsulation inorganic layer that extends up to an upper portion of a third metallic DAM.

The organic light-emitting display device may further include: a storage capacitor including a first electrode coupled or connected to a driving gate electrode of the driving thin film transistor, and a second electrode provided on an upper portion of the first electrode and insulated from the first electrode; and a data line disposed on an upper portion of the second electrode, and the driving gate electrode and the first electrode may be integrally formed in a same layer, the first metallic DAM may be formed in the layer in which the driving gate electrode and the first electrode are formed, the second metallic DAM may be formed in a layer in which the second electrode is formed, and the third metallic DAM may be formed in a layer in which the data line is formed.

According to one or more exemplary embodiments, an organic light-emitting display device includes: a substrate; a driving thin film transistor provided on the substrate; and a DAM disposed at an outermost portion of the substrate, and the DAM includes an inorganic layer and includes a first metallic DAM therein and a second metallic DAM disposed on an upper portion of the first metallic DAM, and the inorganic layer includes a first interlayer insulating layer provided between the first metallic DAM and the second metallic DAM, a second interlayer insulating layer formed on the second metallic DAM, and a thin film encapsulation inorganic layer provided on an upper portion of the second interlayer insulating layer.

The organic light-emitting display device may further include: a storage capacitor including a first electrode coupled or connected to a driving gate electrode of the driving thin film transistor, and a second electrode provided on an upper portion of the first electrode and insulated from the first electrode, and the driving gate electrode and the first electrode may be integrally formed in a same layer, and the first metallic DAM may be formed in the layer in which the driving gate electrode and the first electrode are formed, and the second metallic DAM may be formed in a layer in which the second electrode is formed.

An exemplary embodiment provides a feature (e.g., an advantageous effect) of controlling a Ti tip defect by forming a DAM including a metallic DAM and an inorganic material (e.g., an interlayer insulating layer).

Also, since a DAM includes an inorganic layer, an inorganic layer of a thin film encapsulation structure may extend up to an outer portion, so that a dead space may be suitably or advantageously reduced.

The effect of exemplary embodiments may be derived from content to be described below with reference to the drawings in addition to the above-described content.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
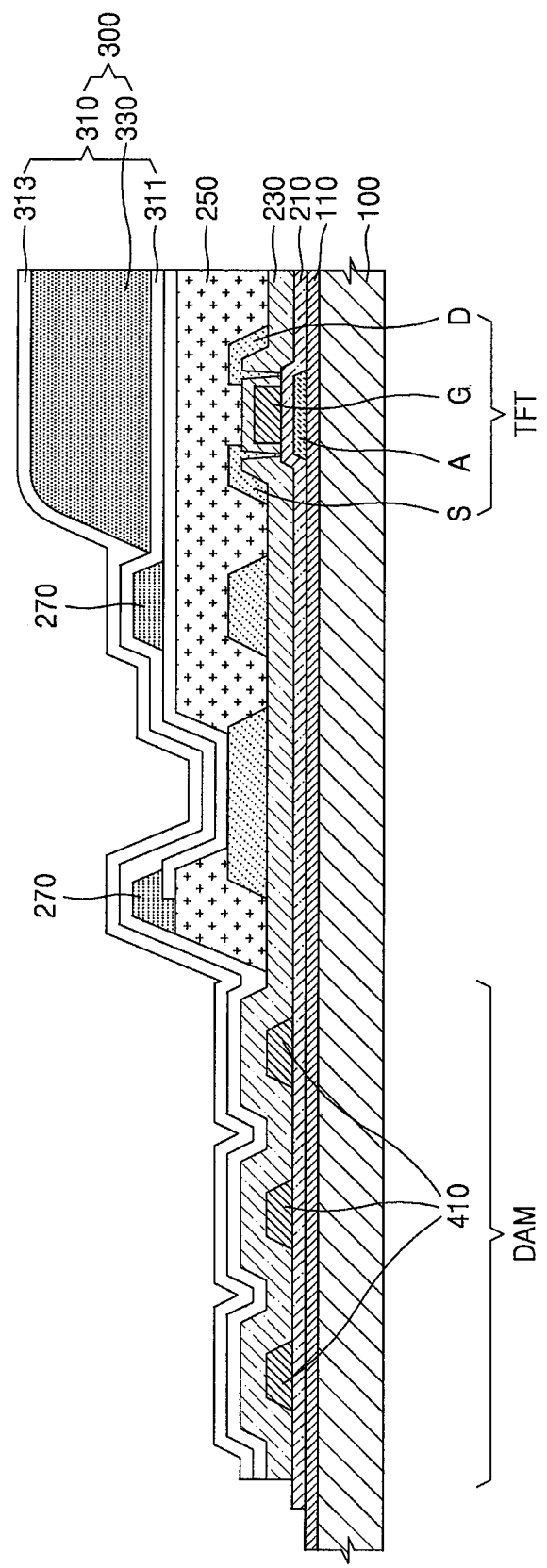
FIG. 1 is a schematic cross-sectional view illustrating an organic light-emitting display device according to an exemplary embodiment.

As the inventive concept allows for various changes and numerous embodiments, exemplary embodiments will be illustrated in the drawings and described in detail in the written description. An effect and a characteristic of the inventive concept, and a method for accomplishing these will be apparent when exemplary embodiments described below in detail are referred together with the drawings. However, the inventive concept is not limited to the exemplary embodiments described below and may be implemented in various forms.

Hereinafter, exemplary embodiments are described in detail with reference to the accompanying drawings. Like reference numerals are used for like or corresponding elements when description is made with reference to the drawings, and repeated description thereof is not provided.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on," "formed on," "coupled to," or "connected to" another layer, region, or component, it can be directly or indirectly on, formed on, coupled to, or connected to the other layer, region, or component. That is, for example, intervening layers, regions, or components may be present. In addition, it will also be understood that when an element or layer is referred to as being "between" two elements or layers, it can be the only element or layer between the two elements or layers, or one or more intervening elements or layers may also be present.

Sizes of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time (e.g., concurrently or simultaneously) or performed in an order opposite to the described order.

Figure 2:
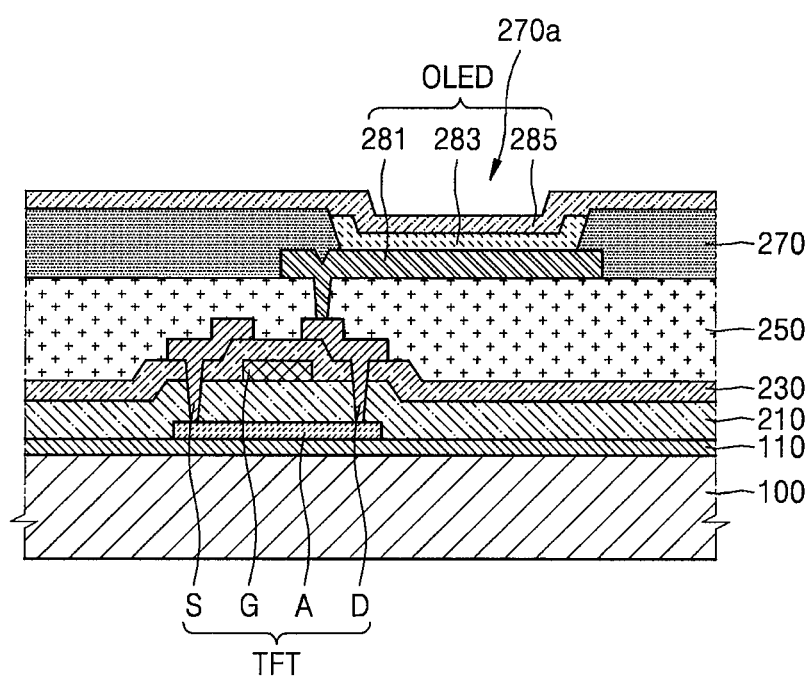
FIG. 2 is a schematic cross-sectional view illustrating a display portion of an organic light-emitting display device according to an exemplary embodiment.

FIG. 1 is a schematic cross-sectional view illustrating an organic light-emitting display device according to an exemplary embodiment, and FIG. 2 is a schematic cross-sectional view illustrating a display portion of an organic light-emitting display device according to an exemplary embodiment.

As illustrated in FIG. 1, a buffer layer 110 may be formed on an upper portion of a substrate 100. The buffer layer 110 may prevent or inhibit impurity ions from diffusing (e.g., from diffusing into the substrate), prevent or inhibit moisture or the air from penetrating (e.g., from penetrating into the display device through the substrate), and serve as a barrier layer and/or a blocking layer for planarizing a surface (e.g., a surface of the substrate).

Referring to FIGS. 1 and 2, a thin film transistor (TFT) may be formed on an upper portion of the buffer layer 110. A semiconductor layer A of the TFT may include polysilicon, and may include a channel region undoped with impurities, and a source region and a drain region respectively doped with impurities, disposed at two (e.g., both) sides of the channel region. Here, the impurities change depending on a kind of the TFT, and may be N-type impurities or P-type impurities (e.g., the source and drain regions may be doped independently with N-type or P-type impurities). After the semiconductor layer A is formed, a gate insulating layer 210 may be formed on an upper portion of the semiconductor layer A over the entire surface (or substantially the entire surface) of the substrate 100. The gate insulating layer 210 may include a single layer or layers (e.g., a plurality of layers) including an inorganic material such as a silicon oxide or a silicon nitride, etc. The gate insulating layer 210 insulates the semiconductor layer A from a gate electrode G disposed thereon.

After the gate insulating layer 120 is formed, the gate electrode G may be formed on an upper portion of the gate insulating layer 120. The gate electrode G may be formed via a photolithography process and/or an etching process.

The gate electrode G may include one or more metals selected from Mo, Al, Pt, Pd, Ag, Mg, Au, Ni, Nd, Ir, Cr, Li, Ca, Ti, W, and Cu.

After the gate electrode G is formed, a first interlayer insulating layer 230 may be formed on the entire surface (or substantially the entire surface) of the substrate 100.

The first interlayer insulating layer 230 may include an inorganic material. For example, the first interlayer insulating layer 230 may include a metallic oxide or a metallic nitride. In some embodiments, the inorganic material may include SiO2, SiNx ($\frac{1}{2} \leq x \leq 2$, e.g., x=1.33), SiON, $Al_2O_3$, TiO2, Ta2O5, HfO2, or ZnO2, etc.

The first interlayer insulating layer 230 may include layers (e.g., a plurality of layers) or a single layer including an inorganic material such as SiOy ($1 \leq y \leq 2$, e.g., y=2) and/or SiNx ($\frac{1}{2} \leq x \leq 2$, e.g., x=1.33), etc. In some exemplary embodiments, the first interlayer insulating layer 230 may include a double structure of SiOy/SiNx or SiNx/SiOy.

As illustrated in FIG. 1, a DAM including the first interlayer insulating layer 230 and including a first metallic dam 410 therein may be at a side of the substrate 100 (e.g., formed on the outermost portion of the substrate 100). An effect that by the DAM, a lateral side of the organic light-emitting display device becomes strong against damage may be obtained (e.g., in some embodiments, the DAM protects the lateral side of the organic light-emitting display from damage). The structure and role of the DAM are described in more detail below.

As illustrated in FIG. 2, a source electrode S, a drain electrode D of the TFT, a data line, and a driving voltage line may be disposed on an upper portion of the first interlayer insulating layer 230.

The source electrode S, the drain electrode D, the data line, and the driving voltage line may include one or more metals selected from Al, Pt, Pd, Ag, Mg, Au, Ni, Nd, Ir, Cr, Li, Ca, Mo, Ti, W, and Cu.

As illustrated in FIG. 2, a via layer 250 is formed on the entire surface (or substantially the entire surface) of the substrate 100 to cover wirings such as, for example, the source electrode S, the drain electrode D, the data line, and/or the driving voltage line. A pixel electrode 281 may be formed on an upper portion of the via layer 250. According to an exemplary embodiment illustrated in FIG. 2, the pixel electrode 281 is coupled or connected with the drain electrode D through a via hole.

The via layer 250 may include an insulating material. For example, the via layer 250 may include a single layer or layers (e.g., a plurality of layers) including an inorganic material, an organic material, or an organic/inorganic compound, and may be formed by using various suitable deposition methods.

As illustrated in FIG. 2, an organic light-emitting diode (OLED) is provided to the upper portion of the via layer 250. The OLED includes the pixel electrode 281, an interlayer 283 including an organic emission layer, and an opposite electrode 285. Also, the organic light-emitting display device of FIG. 2 may further include a pixel defining layer 270. As shown in FIG. 2, the buffer layer 110, the gate insulating layer 210, the first interlayer insulating layer 230, the via layer 250, and the pixel defining layer 270 may be included in a stack 200. In the embodiment shown in FIG. 1, the stack 200 includes the gate insulating layer 210, the first interlayer insulating layer 230, and the via layer 250.

The pixel electrode 281 and/or the opposite electrode 285 may be provided as a transparent electrode or a reflective electrode. In the case where the pixel electrode 281 and/or the opposite electrode 285 are provided as a transparent electrode, they may include ITO, IZO, ZnO, or $In_2O_3$. In the case where the pixel electrode 281 and/or the opposite electrode 285 are provided as a reflective electrode, they may include a reflective layer including Ag, Mg, Al, Pt, Pd, Au, Ni, Nd, Ir, Cr, or a compound thereof, etc., and a transparent layer including ITO, IZO, ZnO, or $In_2O_3$. In some exemplary embodiments, the pixel electrode 281 or the opposite electrode 285 may have an ITO/Ag/ITO structure.

As illustrated in FIG. 2, the pixel defining layer 270 may define a pixel region and a non-pixel region. The pixel defining layer 270 may include an opening 270a that exposes the pixel electrode 281 and may be formed to entirely cover (or substantially entirely cover) the substrate 100 (e.g., the pixel defining layer 270 may be formed to cover the entire or substantially the entire surface of the substrate 100 and the opening 270a may then be formed in the pixel defining layer 270). An interlayer 283 which will be described in more detail below may be formed in the opening 270a, so that the opening 270a may become a substantial pixel region (e.g., the opening 270a may substantially define the pixel region).

The pixel electrode 281, the interlayer 283, and the opposite electrode 285 may form the organic light-emitting diode (OLED). A hole and an electron respectively injected from the pixel electrode 281 and the opposite electrode 285 of the OLED may recombine in the organic emission layer of the interlayer 283 to emit light.

The interlayer 283 may have the organic emission layer. In some embodiments, the interlayer 283 may have the organic emission layer, and besides, may further have at least one selected from a hole injection layer (HIL), a hole transport layer (HTL), an electron transport layer (ETL), and an electron injection layer (EIL). The present exemplary embodiment is not limited thereto, and the interlayer 283 may have the organic emission layer and further have other various suitable functional layers.

The opposite electrode 285 is disposed on the interlayer 283. The opposite electrode 285 forms an electric field with the pixel electrode 281 to allow light to be emitted from the interlayer 283. The pixel electrode 281 may be patterned every pixel (e.g., may be patterned to correspond to the pixels), and the opposite electrode 285 may be formed such that a common voltage is applied over all pixels.

The pixel electrode 281 may serve as an anode electrode, and the opposite electrode 285 may serve as a cathode electrode, but they are not limited thereto. For example, the pixel electrode 281 may serve as a cathode electrode, and the opposite electrode 285 may serve as an anode electrode.

As illustrated in FIG. 1, an encapsulation structure 300 for sealing the OLED from the air and moisture may be formed on the upper portion of the OLED.

The encapsulation structure 300 may be formed in various suitable shapes, and formed by stacking thin films as illustrated in FIG. 1.

The encapsulation structure 300 may be formed on the upper portion of the substrate 100 to cover the OLED as illustrated in FIG. 1. The encapsulation structure 300 is a structure where layers are stacked, and may be formed in a structure where an inorganic layer 310 and an organic layer 330 are stacked in turns (e.g., alternately).

Though FIG. 1 illustrates an exemplary embodiment where a first inorganic layer 311, a first organic layer 330, and a second inorganic layer 313 are sequentially stacked, the number of thin film layers is not limited thereto, of course.

The inorganic layer 310 may solidly block or reduce penetration of oxygen or moisture, and the organic layer 330 may absorb stress of the inorganic layer 310 to give flexibility.

The inorganic layer 310 may be a single layer or a stacked layer including a metallic oxide or a metallic nitride. For example, the inorganic layers may include at least one selected from SiNx (½≤x≤2, e.g., x=1.33), $Al_2O_3$, $SiO_2$, and $TiO_2$.

The organic layer 330 may include a polymer, and for example, may be a single layer or a stacked layer including at least one selected from polyethylene terephthalate, polyimide, polycarbonate, epoxy, polyethylene, and polyacrylate. For example, the organic layers may include polyacrylate. In some embodiments, the organic layers may include a polymerized monomer composition including a diacrylate-based monomer and a triacrylate-based monomer. The monomer composition may further include a monoacrylate-based monomer. Also, the monomer composition may further include a photoinitiator such as monoacrylphosphine oxide (TPO) but is not limited thereto.

The organic light-emitting display device according to an exemplary embodiment may prevent or inhibit penetration of oxygen and moisture and concurrently or simultaneously secure flexibility by forming the encapsulation structure 300 in a structure in which the inorganic layer 310 and the organic layer 330 are stacked alternately.

Figure 3:
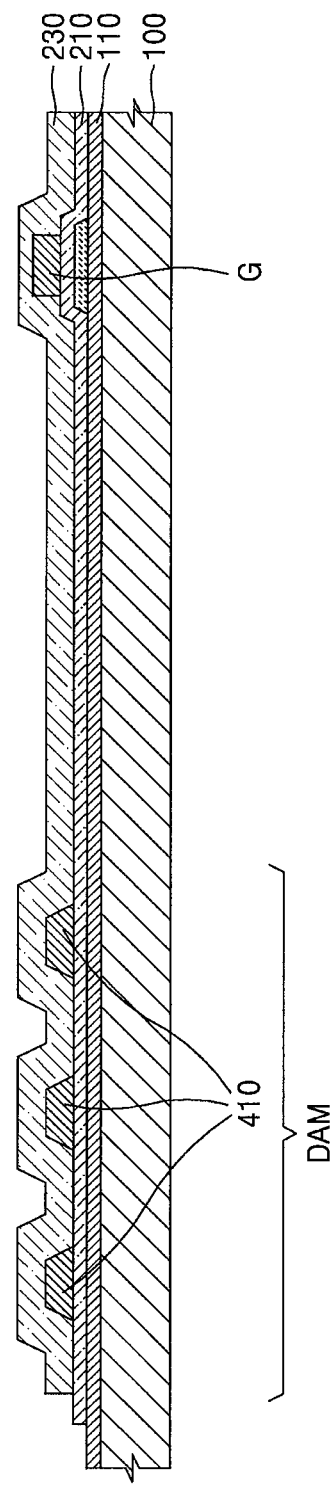
FIG. 3 is a schematic cross-sectional view illustrating a portion of an organic light-emitting display device according to an exemplary embodiment.

FIG. 3 is a schematic cross-sectional view illustrating a portion of an organic light-emitting display device according to an exemplary embodiment.

As illustrated in FIGS. 1 and 3, a DAM including the first interlayer insulating layer 230 and including the first metallic dam 410 therein may be at a side of the substrate 100 (e.g., formed on the outermost portion of the substrate 100).

The DAM may include the first interlayer insulating layer 230 including an inorganic layer, and include the first metallic dam 410 inside the inorganic layer.

The first metallic dam (DAM) 410 may include two or more metals (e.g., two or more metal layers) spaced apart by a set or predetermined interval. FIGS. 1 and 3 illustrate an exemplary embodiment and the first metallic DAM 410 may include three metals (e.g., three metal layers). Of course, the number of metals forming the first metallic DAM 410 is not limited thereto and the first metallic DAM 410 may include a plurality of metals.

The first metallic DAM 410 may include one or more metals selected from Al, Pt, Pd, Ag, Mg, Au, Ni, Nd, Ir, Cr, Li, Ca, Mo, Ti, W, and Cu.

The organic light-emitting display device according to the present exemplary embodiment may include the first metallic DAM 410 where a DAM is formed on the upper portion of the gate insulating layer 210, and the first interlayer insulating layer 230 formed on the upper portion of the first metallic DAM 410 and including an inorganic material as illustrated in FIG. 3.

Also, as illustrated in FIG. 1, the DAM may also include the thin film encapsulation inorganic layer 310 of the encapsulation structure 300 formed on the upper portion of the first interlayer insulating layer 230, that extends up to the outer portion of the substrate 100.

Since the DAM includes the first metallic DAM 410 and the first interlayer insulating layer 230 which is an inorganic layer, a step difference may be formed between the first interlayer insulating layer 230 and the thin film encapsulation inorganic layer 310 of the encapsulation structure 300. For example, the DAM may have a step difference at an upper portion of the inorganic layer (e.g., the first interlayer insulating layer 230) and may have a step difference at a lower portion of the inorganic layer (e.g., the first interlayer insulating layer 230).

Since the DAM at the side of the substrate 100 (e.g., formed on the outermost portion of the substrate 100) is formed to have a step difference by including the first metallic DAM 410, the organic light-emitting display device according to an exemplary embodiment has a feature (e.g., an advantageous effect) of strengthening the lateral structure which would otherwise be more vulnerable to damage.

For example, since the DAM of the organic light-emitting display device according to an exemplary embodiment includes the first metallic DAM 410 having stiffness therein as compared to a DAM that includes an inorganic layer but does not include the first metallic DAM, the organic light-emitting display device is strengthened and thus has a feature of protecting against damage.

Also, the first interlayer insulating layer 230 and the thin film encapsulation inorganic layer 310 are formed to have a step difference at the DAM by the first metallic DAM 410, and thus the organic light-emitting display device has a feature (e.g., an advantageous effect) of controlling Ti tip.

Ti tip is a problem caused by a crack DAM (e.g., a cracked DAM) including an inorganic layer. Since a profile of the crack DAM that includes an inorganic layer but does not include the first metallic DAM is formed to have an angle of 80-90 degrees (e.g., an angle of 80 to 90 degrees relative to the upper surface of the substrate), when etching is performed after a layer is formed during a process of forming S/D (e.g., source/drain), a residual layer of S/D remains.

At this point, there is a probability that a Ti component of an S/D residual layer is separated and moves into a display region during a subsequent process, and a defective display device may be caused by this Ti component of the S/D residual layer. For example, Ti tip caused by a DAM that includes an inorganic layer but does not include the first metallic DAM may result in a defective display device as a result of Ti contaminating the display region of the display device.

To solve this problem, an organic light-emitting display device according to the present exemplary embodiment allows a DAM at the side of the substrate (e.g., formed on the outermost portion) to be formed to have a step difference by including the first metallic DAM 410, so that a profile lowers (e.g., a profile of the DAM is reduced), and consequently, the S/D residual layer does not remain and thus a defect generation by Ti tip may be suitably or advantageously prevented or reduced.

Furthermore, since the DAM includes the first interlayer insulating layer 230 including an inorganic layer, extension of the thin film encapsulation inorganic layer 310 is possible, and consequently, a dead space may be suitably or advantageously reduced.

For example, a DAM structure such as a metallic DAM is generally formed by using an inorganic layer without a structure such as the first metallic DAM disclosed by the present exemplary embodiment, and an organic layer VIA layer covers the inorganic layer DAM in order to control a Ti tip defect.

Accordingly, when the inorganic layer DAM and the organic layer VIA layer that covers the same form a DAM, but do not include the first metallic DAM, and a separation between the organic layer VIA layer and the thin film encapsulation inorganic layer is required, it is difficult to extend the thin film encapsulation inorganic layer.

For example, when the thin film encapsulation inorganic layer cannot be extended and the DAM should be spaced apart by a set or predetermined interval, a dead space is extended.

On the other hand, in the organic light-emitting display device according to the present exemplary embodiment, the DAM includes the first metallic DAM 410 and includes the first interlayer insulating layer 230 that covers the first metallic DAM 410 and includes an inorganic material, so that not only the lateral structure is strengthened by the first metallic DAM 410 but also thin film encapsulation inorganic layer 310 may be suitably or advantageously extended up to side of the substrate (e.g., the outermost portion of the substrate).

The first metallic DAM 410 according to the present exemplary embodiment may be formed in a layer where the driving gate electrode G of the driving TFT (refer to FIG. 2) is formed as illustrated in FIG. 1. For example, in manufacturing the organic light-emitting display device according to the present exemplary embodiment, the first metallic DAM 410 and the driving gate electrode G may be concurrently or simultaneously formed.

Figure 4:
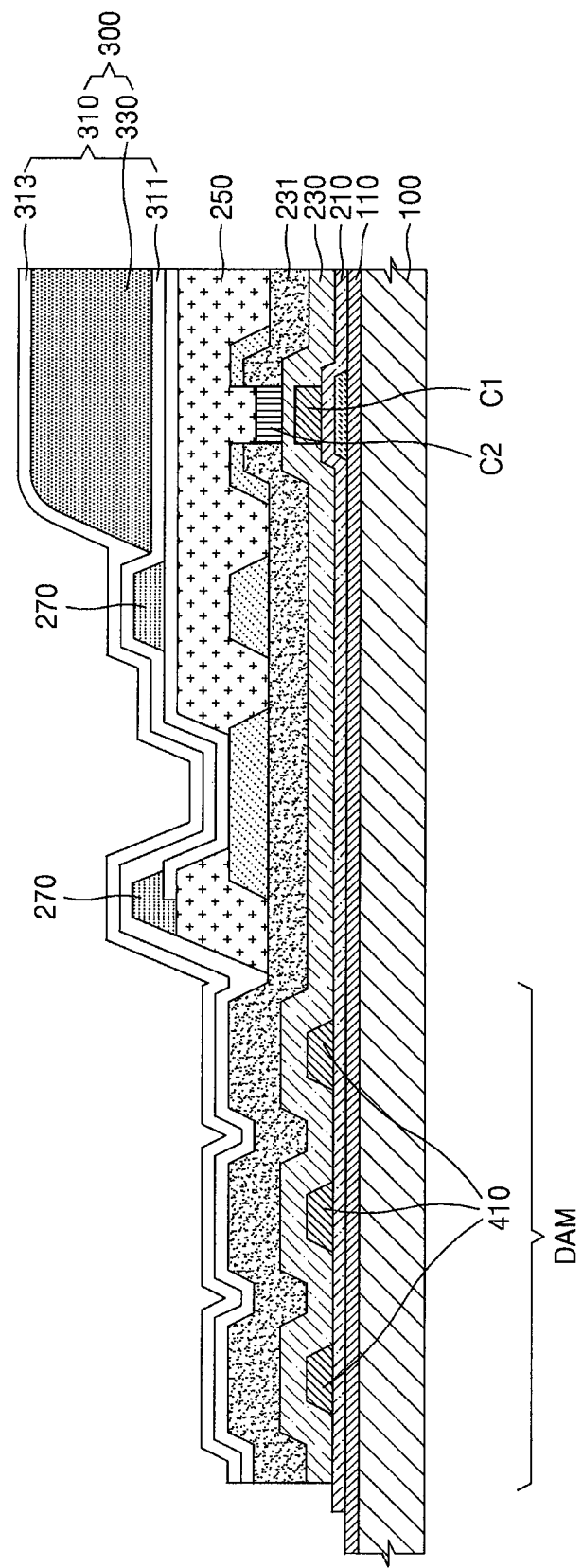
FIG. 4 is a schematic cross-sectional view illustrating an organic light-emitting display device according to an exemplary embodiment.

FIG. 4 is a schematic cross-sectional view illustrating an organic light-emitting display device according to an exemplary embodiment. In FIG. 4, like reference numerals used for FIGS. 1 to 3 represent like members, and duplicated descriptions of the like members are not provided for conciseness of description herein.

In the organic light-emitting display device according to the present exemplary embodiment, the driving gate electrode G of the driving TFT may be coupled or connected with a first electrode C1 of a storage capacitor Cst. In more detail, the driving gate electrode G is integrally formed in a layer where the first electrode C1 is formed. For example, the storage capacitor may include the first electrode coupled with the driving gate electrode.

Also, a second electrode C2 of the storage capacitor Cst is disposed such that at least a portion of the second electrode C2 overlaps the first electrode C1, and the second electrode C2 may be formed in a layer where a driving voltage line is formed. For example, the storage capacitor may include the second electrode on an upper portion of the first electrode and insulated from the first electrode.

In the case where a distance between wirings disposed to overlap such as the first electrode C1 and the second electrode C2 is close, parasitic capacitance between the wirings may occur, and an interference phenomenon between transferred signals may occur due to the wirings (e.g., due to the proximity of the wirings to each other). To reduce this parasitic capacitance and/or a signal interference phenomenon, the present exemplary embodiment may include a second interlayer insulating layer 231. As shown in FIG. 4, the stack 200 may include the gate insulating layer 210, the first interlayer insulating layer 230, the second interlayer insulating layer 231, and the via layer 250.

The second interlayer insulating layer 231 is disposed on the first interlayer insulating layer 230 and includes an opening that exposes a portion of the first interlayer insulating layer 230. The second electrode C2 of the storage capacitor Cst is disposed in the opening.

For example, the organic light-emitting display device according to the present exemplary embodiment may include the substrate 100, the TFT provided to the substrate 100, the storage capacitor Cst, the first interlayer insulating layer 230, the second interlayer insulating layer 231, and the DAM formed on the outermost portion of the substrate 100.

As described above, the second interlayer insulating layer 231 may be additionally disposed between these wirings and/or the wiring and the TFT to reduce a value of parasitic capacitance and/or signal interference. Meanwhile, there is a portion between the first electrode C1 and the second electrode C2 of the storage capacitor Cst where the second interlayer insulating layer 231 is not disposed, so that the storage capacitor Cst may maintain high storage capacity.

The first interlayer insulating layer 230 is intended for securing high storage capacity of the storage capacitor Cst. In the organic light-emitting display device according to the present exemplary embodiment, the first interlayer insulating layer 230 may suitably or advantageously include an inorganic material having a high dielectric constant as described above. Also, the second interlayer insulating layer 231 may also include an inorganic material.

In the organic light-emitting display device according to the present exemplary embodiment, since the first metallic DAM 410 may be formed in a layer where the driving gate electrode G of the driving TFT is formed, and since the driving gate electrode G may be integrally formed in a layer where the first electrode C1 is formed, the first metallic DAM 410 may be formed in a layer where the driving gate electrode G and the first electrode C1 are formed.

Figure 5:
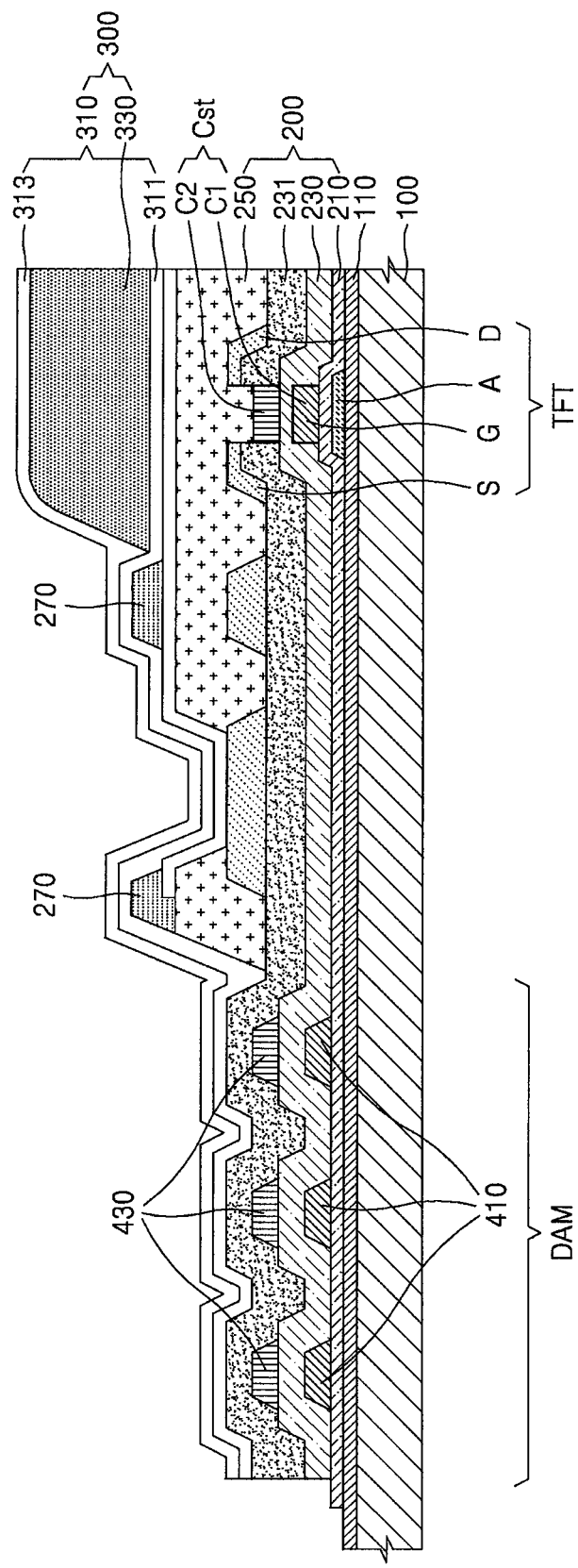
FIG. 5 is a schematic cross-sectional view illustrating an organic light-emitting display device according to an exemplary embodiment.

FIG. 5 is a schematic cross-sectional view illustrating an organic light-emitting display device according to an exemplary embodiment. In FIG. 5, like reference numerals used for FIGS. 1 to 4 represent like members, and duplicated descriptions of the like members are not provided for conciseness of description herein.

As illustrated in FIG. 5, in the organic light-emitting display device according to the present exemplary embodiment, the DAM may further include a second metallic DAM 430 formed on an upper portion of the first metallic DAM 410.

In the organic light-emitting display device according to the present exemplary embodiment, since the DAM disposed on the outermost portion of the substrate 100 doubly includes the metallic layer having stiffness, the lateral structure is suitably or advantageously strengthened against damage.

Like the first metallic DAM 410, the second metallic DAM 430 may include two or more metals (e.g., two or more metal layers) spaced apart by a set or predetermined interval. Though FIG. 5 illustrates an exemplary embodiment where the first metallic DAM 410 and the second metallic DAM 430 respectively include three metals (e.g., three metal layers) spaced apart by a set or predetermined interval, the first metallic DAM 410 and the second metallic DAM 430 are not limited thereto, of course.

The DAM of the organic light-emitting display device according to the present exemplary embodiment may include the first metallic DAM 410, the first interlayer insulating layer 230 that covers the first metallic DAM 410 and includes an inorganic material, the second metallic DAM 430 formed on the upper portion of the first interlayer insulating layer 230, and the second interlayer insulating layer 231 that covers the second metallic DAM 430 and includes an inorganic material.

Also, like the above-described exemplary embodiments, the DAM may include the thin film encapsulation inorganic layer 310 disposed on the upper portion of the second interlayer insulating layer 231 and extending up to the outermost portion of the substrate 100.

This is because the first interlayer insulating layer 230 and the second interlayer insulating layer 231 include an inorganic material, and thus, the thin film encapsulation inorganic layer 310 may extend without separation, and consequently, a dead space may be suitably or advantageously reduced.

In the organic light-emitting display device according to the present exemplary embodiment, the driving gate electrode G of the driving TFT may be coupled or connected with the first electrode C1 of the storage capacitor Cst. In more detail, the driving gate electrode G may be integrally provided to a layer where the first electrode C1 is formed.

Also, the second electrode C2 of the storage capacitor Cst may be disposed such that at least a portion of the second electrode C2 overlaps the first electrode C1, and the second interlayer insulating layer 231 may include an opening that exposes a portion of the first interlayer insulating layer 230, and the second electrode C2 may be disposed in the opening.

In the organic light-emitting display device according to the present exemplary embodiment, the first metallic DAM 410 may be formed in a layer where the driving gate electrode G of the driving TFT and the first electrode C1 are formed. For example, the first metallic DAM 410 may be concurrently or simultaneously formed when the driving gate electrode G and the first electrode C1 are integrally formed.

Also, the second metallic DAM 430 may be formed in a layer where the second electrode C2 of the storage capacitor Cst is formed. For example, the second metallic DAM 430 and the second electrode C2 may be concurrently or simultaneously formed, and after the second metallic DAM 430 and the second electrode C2 are formed, the second interlayer insulating layer 231 that covers these features may be formed thereon.

Since the DAM of the organic light-emitting display device according to the present exemplary embodiment includes the first metallic DAM 410 and the second metallic DAM 430, a step difference may be formed at the first interlayer insulating layer 230, the second interlayer insulating layer 231, and the thin film encapsulation inorganic layer 310. Accordingly, Ti tip may be suitably or advantageously controlled.

Ti tip is a problem caused by a crack DAM (e.g., a cracked DAM) including an inorganic layer. Since a profile of the crack DAM that includes an inorganic layer, but does not include the first metallic DAM, is formed to have an angle of 80-90 degrees (e.g., an angle of 80 to 90 degrees relative to the upper surface of the substrate), when etching is performed after a layer is formed during a process of forming S/D (e.g., source/drain), a residual layer of S/D remains.

At this point, there is a probability that a Ti component of an S/D residual layer is separated and moves into a display region during a subsequent process, and a defective display device may be caused by this Ti component of the S/D residual layer. For example, Ti tip caused by a DAM that includes an inorganic layer but does not include the first metallic DAM may result in a defective display device as a result of Ti contaminating the display region of the display device.

To solve this problem, an organic light-emitting display device according to the present exemplary embodiment allows a DAM at the side of the substrate (e.g., formed on the outermost portion) to be formed to have a step difference by including the first metallic DAM 410, so that a profile lowers (e.g., a profile of the DAM is reduced), and consequently, the S/D residual layer does not remain and thus a defect generation by Ti tip may be suitably or advantageously prevented or reduced.

Figure 6:
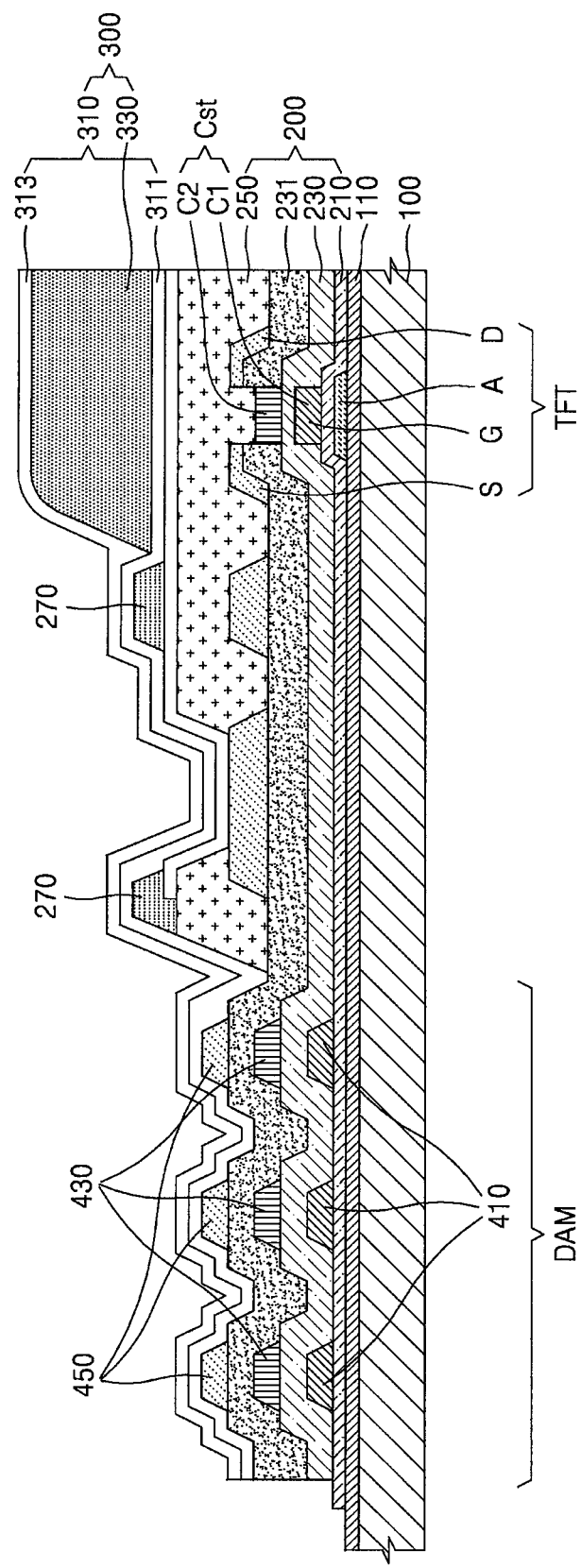
FIG. 6 is a schematic cross-sectional view illustrating an organic light-emitting display device according to an exemplary embodiment.

FIG. 6 is a schematic cross-sectional view illustrating an organic light-emitting display device according to an exemplary embodiment. In FIG. 6, like reference numerals used for FIGS. 1 to 5 represent like members, and duplicated descriptions of the like members are not provided for conciseness of description herein.

As illustrated in FIG. 6, in the organic light-emitting display device according to the present exemplary embodiment, a DAM may include the first metallic DAM 410, the second metallic DAM 430 formed on the upper portion of the first metallic DAM 410, and may further include a third metallic DAM 450 formed on an upper portion of the second metallic DAM 430.

In the organic light-emitting display device according to the present exemplary embodiment, since the DAM at a side of the substrate 100 (e.g., disposed on the outermost portion of the substrate 100) triply includes metal layers having stiffness, the lateral structure is suitably or advantageously strengthened against damage.

Like the first metallic DAM 410 and the second metallic DAM 430, the third metallic DAM 450 may include two or more metals (e.g., two or more metal layers) spaced apart by a set or predetermined interval. Though FIG. 6 illustrates an exemplary embodiment where the first metallic DAM 410, the second metallic DAM 430, and the third metallic DAM 450 respectively include three metals (e.g., three metal layers) spaced apart by a set or predetermined interval, the DAM is not limited thereto, of course.

The DAM of the organic light-emitting display device according to the present exemplary embodiment may include the first metallic DAM 410, the first interlayer insulating layer 230 that covers the first metallic DAM 410 and includes an inorganic material, the second metallic DAM 430 formed on the upper portion of the first interlayer insulating layer 230, the second interlayer insulating layer 231 that covers the second metallic DAM 430 and includes an inorganic material, the third metallic DAM 450 formed on the upper portion of the second interlayer insulating layer 231, and the thin film encapsulation inorganic layer 310 that extends up to the side of the substrate 100 (e.g., the outermost portion of the substrate 100) to cover the third metallic DAM 450.

Since the first interlayer insulating layer 230 and the second interlayer insulating layer 231 respectively include an inorganic material, the thin film encapsulation inorganic layer 310 may extend up to the DAM without separation, and consequently, a dead space may be suitably or advantageously reduced.

In the organic light-emitting display device according to the present exemplary embodiment, the driving gate electrode G of the driving TFT may be coupled or connected with the first electrode C1 of the storage capacitor Cst. In more detail, the driving gate electrode G may be integrally provided to a layer where the first electrode C1 is formed.

The second electrode C2 of the storage capacitor Cst may be disposed such that at least a portion of the second electrode C2 overlaps the first electrode C1, and the second interlayer insulating layer 231 may include an opening that exposes a portion of the first interlayer insulating layer 230, and the second electrode C2 may be disposed in the opening.

Also, a source electrode S, a drain electrode D, and a data line may be provided to the upper portion of the second interlayer insulating layer 231.

In the organic light-emitting display device according to the present exemplary embodiment, the first metallic DAM 410 may be formed in a layer where the driving gate electrode G of the driving TFT and the first electrode C1 of the storage capacitor Cst integrally formed with the driving gate electrode G are formed. The second metallic DAM 430 may be formed in a layer where the second electrode C2 of the storage capacitor Cst is formed.

Also, the third metallic DAM 450 may be formed in a layer where the data line is formed.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

While one or more exemplary embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. An organic light-emitting display device comprising:
   a substrate;
   a driving thin film transistor on the substrate;
   an organic light emitting diode on an upper portion of the driving thin film transistor;
   an encapsulation structure on an upper portion of the organic light-emitting diode and sealing the organic light-emitting diode; and
   a DAM at an outermost portion of the substrate,
   wherein the DAM comprises an inorganic layer and a first metallic DAM,
   wherein the inorganic layer extends between the organic light emitting diode and the substrate,
   wherein the encapsulation structure comprises alternately stacked thin film encapsulation organic layers and thin film encapsulation inorganic layers, and
   wherein the thin film encapsulation inorganic layers extend over the first metallic DAM, and the organic light emitting diode is between the inorganic layer of the DAM and the thin film encapsulation inorganic layers.

2. The device of claim 1, wherein the first metallic DAM comprises two or more metal layers spaced apart at a set interval.

3. The device of claim 2, wherein the first metallic DAM comprises three metal layers spaced apart at a set interval.

4. The device of claim 1, wherein the DAM has a step difference at an upper portion of the inorganic layer and a step difference at a lower portion of the inorganic layer of the first metallic DAM.

5. The device of claim 1, wherein the first metallic DAM is formed on an upper portion of a gate insulating layer; and
   wherein the inorganic layer comprises a first interlayer insulating layer provided on an upper portion of the first metallic DAM.

6. The device of claim 5, further comprising:
   a storage capacitor comprising a first electrode coupled with a driving gate electrode of the driving thin film transistor, and a second electrode on an upper portion of the first electrode and insulated from the first electrode,
   wherein the driving gate electrode and the first electrode are integrally formed in a same layer, and the first metallic DAM is in the layer in which the driving gate electrode and the first electrode are formed.

7. The device of claim 6, wherein the first interlayer insulating layer is between the first electrode and the second electrode and insulates the second electrode from the first electrode.

8. The device of claim 6, further comprising:
   a second interlayer insulating layer on the first interlayer insulating layer and having an opening that exposes a portion of the first interlayer insulating layer,
   wherein the second electrode is in the opening.

9. The device of claim 5, wherein the thin film encapsulation inorganic layers are on a portion of the first interlayer insulating layer.

10. The device of claim 1, wherein the DAM further comprises a second metallic DAM on an upper portion of the first metallic DAM.

11. The device of claim 10, wherein the second metallic DAM comprises two or more metal layers spaced apart at a set interval.

12. The device of claim 10, wherein the DAM further comprises:
a first interlayer insulating layer formed between the first metallic DAM and the second metallic DAM; and
a second interlayer insulating layer formed on an upper portion of the first interlayer insulating layer and covering the second metallic DAM.

13. The device of claim 10, further comprising:
a storage capacitor comprising a first electrode coupled with a driving gate electrode of the driving thin film transistor, and a second electrode on an upper portion of the first electrode and insulated from the first electrode,
wherein the driving gate electrode and the first electrode are integrally formed in a same layer, the first metallic DAM is in the layer in which the driving gate electrode and the first electrode are formed, and the second metallic DAM is formed in a layer in which the second electrode is formed.

14. The device of claim 13, wherein:
the inorganic layer comprises a first interlayer insulating layer,
the device further comprises a second interlayer insulating layer on the first interlayer insulating layer and having an opening that exposes a portion of the first interlayer insulating layer, and
the second electrode is in the opening.

15. The device of claim 14, further comprising:
wherein the thin film encapsulation inorganic layers are on a portion of the second interlayer insulating layer.

16. The device of claim 10, wherein the DAM further comprises a third metallic DAM on an upper portion of the second metallic DAM.

17. The device of claim 16, wherein the third metallic DAM comprises two or more metal layers spaced apart at a set interval.

18. The device of claim 16, wherein the inorganic layer comprises:
a first interlayer insulating layer formed between the first metallic DAM and the second metallic DAM; and
a second interlayer insulating layer formed on an upper portion of the second metallic DAM.

19. The device of claim 16, further comprising:
a storage capacitor comprising a first electrode coupled to a driving gate electrode of the driving thin film transistor, and a second electrode on an upper portion of the first electrode and insulated from the first electrode; and
a data line on an upper portion of the second electrode,
wherein the driving gate electrode and the first electrode are integrally formed in a same layer, the first metallic DAM is in the layer in which the driving gate electrode and the first electrode are formed, the second metallic DAM is in a layer in which the second electrode is formed, and the third metallic DAM is in a layer in which the data line is formed.

20. An organic light-emitting display device comprising:
a substrate;
a driving thin film transistor on the substrate;
an organic light emitting diode on an upper portion of the driving thin film transistor;
an encapsulation structure on an upper portion of the organic light-emitting diode and sealing the driving thin film transistor; and
a DAM at an outermost portion of the substrate,
wherein the DAM comprises an inorganic layer, a first metallic DAM and a second metallic DAM on an upper portion of the first metallic DAM,
wherein the inorganic layer comprises a first interlayer insulating layer between the first metallic DAM and the second metallic DAM such that the first metallic DAM does not physically contact the second metallic DAM, and a second interlayer insulating layer on the second metallic DAM,
wherein the encapsulation structure comprises alternately stacked thin film encapsulation organic layers and thin film encapsulation inorganic layers, and
wherein the thin film encapsulation inorganic layers extend over the first metallic DAM, and the organic light emitting diode is between the inorganic layer of the DAM and the thin film encapsulation inorganic layers.

21. The device of claim 20, further comprising:
a storage capacitor comprising a first electrode coupled to a driving gate electrode of the driving thin film transistor, and a second electrode on an upper portion of the first electrode and insulated from the first electrode,
wherein the driving gate electrode and the first electrode are integrally formed in a same layer, the first metallic DAM is in the layer in which the driving gate electrode and the first electrode are formed, and the second metallic DAM is in a layer in which the second electrode is formed.

* * * * *